(12) United States Patent
Kusuda

(10) Patent No.: US 9,735,736 B2
(45) Date of Patent: Aug. 15, 2017

(54) APPARATUS AND METHODS FOR REDUCING INPUT BIAS CURRENT OF AN ELECTRONIC CIRCUIT

(71) Applicant: ANALOG DEVICES, INC., Norwood, MA (US)

(72) Inventor: Yoshinori Kusuda, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/993,969

(22) Filed: Jan. 12, 2016

(65) Prior Publication Data

US 2016/0126898 A1    May 5, 2016

Related U.S. Application Data

(62) Division of application No. 14/201,234, filed on Mar. 7, 2014, now Pat. No. 9,246,484.

(51) Int. Cl.
*H03F 1/02* (2006.01)
*H03K 17/16* (2006.01)
(Continued)

(52) U.S. Cl.
CPC .......... *H03F 1/0205* (2013.01); *H03F 3/387* (2013.01); *H03F 3/45179* (2013.01);
(Continued)

(58) Field of Classification Search
CPC .... H03F 1/0205; H03F 3/387; H03F 3/45179; H03F 3/45183; H03F 3/45556; H03K 17/162; H03M 1/66
(Continued)

(56) References Cited

U.S. PATENT DOCUMENTS

| 4,988,902 A | 1/1991 | Dingwall |
| 6,262,626 B1 | 7/2001 | Bakker et al. |

(Continued)

FOREIGN PATENT DOCUMENTS

| JP | 2005-268859 A | 9/2005 |
| JP | 2010-118931 A | 5/2010 |

OTHER PUBLICATIONS

Office Action dated Aug. 23, 2016 and English Translation thereof for Korean Patent Application No. 10-2015-30597, 9 pages.
(Continued)

*Primary Examiner* — William Hernandez
(74) *Attorney, Agent, or Firm* — Knobbe, Martens, Olson & Bear LLP

(57) ABSTRACT

Apparatus and methods for reducing input bias current of electronic circuits are provided herein. In certain implementations, an electronic circuit includes a first input terminal, a second input terminal, an input circuit, and a plurality of input switches including at least a first input switch and a second input switch. The first input switch is electrically connected between the first input terminal and a first input of the input circuit, the second input switch is electrically connected between the second input terminal and a second input of the input circuit, and the first and second input switches can be opened and closed using a clock signal. The electronic circuit further includes a charge compensation circuit for compensating for charge injection through the first and second input switches during transitions of the clock signal.

20 Claims, 9 Drawing Sheets

(51) Int. Cl.
*H03M 1/66* (2006.01)
*H03F 3/45* (2006.01)
*H03F 3/387* (2006.01)

(52) U.S. Cl.
CPC ..... *H03F 3/45183* (2013.01); *H03F 3/45556* (2013.01); *H03K 17/162* (2013.01); *H03M 1/66* (2013.01); *H03F 2203/45044* (2013.01); *H03F 2203/45454* (2013.01); *H03F 2203/45466* (2013.01); *H03F 2203/45544* (2013.01); *H03F 2203/45562* (2013.01); *H03F 2203/45604* (2013.01); *H03F 2203/45606* (2013.01); *H03F 2203/45702* (2013.01)

(58) Field of Classification Search
USPC .............. 327/124, 530, 535, 536, 537, 547; 330/251
See application file for complete search history.

(56) References Cited

U.S. PATENT DOCUMENTS

| | | | |
|---|---|---|---|
| 6,380,801 | B1 | 4/2002 | McCartney |
| 6,476,671 | B1 | 11/2002 | Tang |
| 7,091,771 | B2 | 8/2006 | Thompson et al. |
| 9,246,484 | B2 | 1/2016 | Kusuda |
| 2006/0244521 | A1* | 11/2006 | Yoshida .............. H03F 3/45775 330/9 |
| 2009/0102517 | A1 | 4/2009 | Setterberg |
| 2011/0063146 | A1 | 3/2011 | Mathews et al. |
| 2011/0316621 | A1 | 12/2011 | Burt et al. |
| 2013/0194122 | A1 | 8/2013 | Sarraj et al. |

OTHER PUBLICATIONS

C. C. Enz and G. C. Temes, "Circuit Techniques for Reducing the Effect of Op-Amp Imperfections: Autozeroing, Correlated Double Sampling, and Chopper Stabilization" Proceedings of the IEEE, vol. 84, No. 11, pp. 1584-1614, Nov. 1996.

Q. Fan, J. H. Huijsing, and K. A. A. Makinwa, "Input characteristics of a chopped multi-path current feedback instrumentation amplifier" IEEE IWASI Dig. Tech. Papers, pp. 61-66, Jun. 2011.

A. Bakker, K. Thiele, and J. H. Huijsing, "A CMOS Nested-Chopper Instrumentation Amplifier with 100-nV Offset" IEEE Journal of Solid-State Circuits, vol. 35, No. 12, pp. 1877-1883, Dec. 2000.

Nguyen et al., "A Time-Interleaved Chopper-Stabilized Delta-Sigma Analog to Digital Converter", 9th Annual Conference on Electronics, Circuits and Systems, vol. 1, pp. 299-302, Feb. 2002.

Eklund et al., "Digital Offset Compensation of Time-Interleaved ADS Using Random Chopper Sampling", ISCAS 2000—IEEE International Symposium on Circuits and Systems, May 2000. 4 pages.

Opris et al., "A Rail-to-Rail Ping-Pong Op-Amp", IEEE Journal of Solid-State Circuits, vol. 31, No. 9, Sep. 1996. 5 pages.

Coln, Michael, "Chopper Stabilization of MOS Operational Amplifiers Using Feed-Forward Techniques", IEEE Journal of Solid-State Circuits, vol. SC-16, No. 6, Dec. 1981. 4 pages.

LTC1150, Linear Technology, "±15V Chopper Stabilized Operational Amplifier with Internal Capacitors." 1991. 11 pages.

LTC Application Note 21, Linear Technology, "Composite Amplifiers." Jul. 1986. 12 pages.

LTC1150, Linear Technology, "± 15V Zero-Drift Operational Amplifier with Internal Capacitors." 1991. 16 pages.

Office Action dated Mar. 22, 2016 and English translation thereof for Japanese Patent Application No. 2015-44477. 24 pages.

Office Action dated Feb. 24, 2017 and English Translation thereof for Korean Patent Application No. 10-2015-30597, 5 pages.

Office Action dated Feb. 28, 2017 and English Translation thereof for Japanese Patent Application 2015-44477.

* cited by examiner

APPARATUS AND METHODS FOR
REDUCING INPUT BIAS CURRENT OF AN
ELECTRONIC CIRCUIT

CROSS-REFERENCE TO RELATED APPLICATIONS

This application is a divisional of U.S. application Ser. No. 14/201,234, filed Mar. 7, 2014, and titled "APPARATUS AND METHODS FOR INPUT BIAS CURRENT REDUCTION," the entire disclosure of which is hereby incorporated herein by reference.

BACKGROUND

Field

Embodiments of the invention relate to electronic devices, and more particularly, to input bias current reduction in electronic circuits.

Description of the Related Technology

An electronic circuit can include an input circuit, such as an amplification circuit, and switches through which an input signal is provided to the input circuit. For example, a pair of field effect transistors (FETs) can be included at an amplification circuit's differential input, and the gate voltages of the FETs can be controlled using a clock signal to turn on or turn off the FETs to pass or block a differential input signal.

Including input switches in an electronic circuit can be useful for a variety of purposes. For example, an amplifier can use input switches for chopping or autozeroing operations of the amplifier. In another example, a switched capacitor circuit can include input switches that are used in part for controlling a phase that the switched capacitor circuit operates in.

SUMMARY

In one embodiment, an electronic circuit is provided. The electronic circuit includes a first input terminal, a second input terminal, an input circuit including a first input and a second input, and a plurality of input switches controlled by one or more clock signals. The plurality of input switches includes a first input switch electrically connected between the first input terminal and the first input of the input circuit, and a second input switch electrically connected between the second input terminal and the second input of the input circuit. The electronic circuit further includes a charge compensation circuit including a first output and a second output. The charge compensation circuit is configured to compensate for charge injected by the plurality of input switches associated with at least one transition of the one or more clock signals.

In another embodiment, a method of reducing input bias current is provided. The method includes providing a differential input voltage between a first input terminal and a second input terminal of an electronic circuit, the electronic circuit including a plurality of input switches and an input circuit. The method further includes controlling the plurality of input switches using one or more clock signals, the plurality of input switches including a first input switch electrically connected between the first input terminal and the first input of the input circuit, and a second input switch electrically connected between the second input terminal and the second input of the input circuit. The method further includes compensating for charge injected by the plurality of input switches associated with at least one transition of the one or more clock signals using a charge compensation circuit.

In another embodiment, an apparatus is provided. The apparatus includes a first input terminal, a second input terminal, an input circuit including a first input and a second input, and a plurality of input switches controlled by one or more clock signals. The plurality of input switches includes a first input switch electrically connected between the first input terminal and the first input of the input circuit, and a second input switch electrically connected between the second input terminal and the second input of the input circuit. The apparatus further includes a means for compensating charge injected by the plurality of input switches.

DETAILED DESCRIPTION OF EMBODIMENTS

Figure 1A:
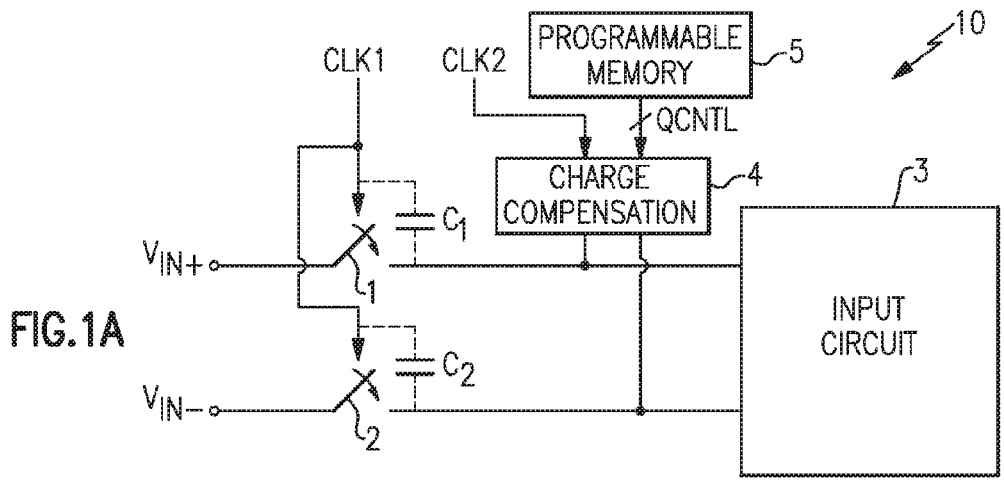
FIG. 1A is a schematic diagram of one embodiment of an electronic circuit.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Certain electronic circuits can use input switches to pass or block a differential input signal. For instance, in one example, a chopper amplifier can include input chopping switches that can be used to modulate the differential input signal using a chopping clock signal before it is provided to amplification circuitry. In another example, an autozero amplifier can include autozero switches that can be used to control operation of an amplifier between an autozero phase and an amplification phase, and the differential input signal can pass through the autozero switches during the amplification phase. Other examples of electronic circuits using input switches include analog-to-digital converters (ADCs) and switched capacitor circuits.

Although using input switches in an electronic circuit can be useful in a variety of applications, the input switches can also generate charge injection. For instance, when the input switches are implemented using field-effect transistors (FETs) having gates controlled using one or more clock signals, displacement currents can flow through parasitic gate-to-source and/or gate-to-drain capacitors in response to clock signal transitions. The injected charge can accumulate over time, and can lead to a flow of input bias current, which can be undesirable.

Overview of Examples of Electronic Circuits Including Charge Compensation Circuits Apparatus and methods for reducing input bias current are provided herein. In certain implementations, an electronic circuit includes a first input terminal, a second input terminal, an input circuit, and a plurality of input switches including at least a first input switch and a second input switch. The first input switch is electrically connected between the first input terminal and a first input of the input circuit, the second input switch is electrically connected between the second input terminal and a second input of the input circuit, and the first and second input switches can be opened and closed using a clock signal. The electronic circuit further includes a charge compensation circuit for compensating for charge injection through the first and second input switches during transitions of the clock signal.

In certain implementations, the charge compensation circuit can receive a charge control signal, which can be set one of multiple charge control values. The charge control signal can be used to control amounts of charge that the charge compensation circuit generates at the input circuit's first and second inputs to compensate for charge injection of the plurality of input switches associated with a transition of the clock signal. In certain configurations, the charge control signal is generated by a programmable memory that stores a charge compensation value determined during testing. In other configurations, the charge compensation value is determined on-chip during a calibration cycle.

FIG. 1A is a schematic diagram of one embodiment of an electronic circuit 10. The electronic circuit 10 includes a first or non-inverting input voltage terminal $V_{IN+}$, a second or inverting input voltage terminal $V_{IN-}$, a first input switch 1, a second input switch 2, an input circuit 3, a charge compensation circuit 4, and a programmable memory 5.

The first input switch 1 includes a control input that receives a first clock signal CLK1, a switch input electrically connected to the non-inverting input voltage terminal $V_{IN+}$, and a switch output electrically connected to a first input of the input circuit 3 and to a first output of the charge compensation circuit 4. The second input switch 2 includes a control input that receives the first clock signal CLK1, a switch input electrically connected to the inverting input voltage terminal $V_{IN-}$, and a switch output electrically connected to a second input of the input circuit 3 and to a second output of the charge compensation circuit 4. In the illustrated configuration, the charge compensation circuit 4 is further configured to receive a second clock signal CLK2 and a charge control signal QCNTL generated by the programmable memory 5.

As shown in FIG. 1A, a first parasitic capacitor $C_1$ can be present between the control input of the first input switch 1 and the first input of the input circuit 3. Additionally, a second parasitic capacitor $C_2$ can be present between the control input of the second input switch 2 and the second input of the input circuit 3. The first and second parasitic capacitors $C_1$, $C_2$ can arise from a variety of sources, including, for example, parasitic junction capacitances and/or capacitive coupling between interconnect.

During a transition of the first clock signal CLK1, charge can flow into or out of the input circuit's first and second inputs. For instance, transitory displacement currents can flow through the first and second parasitic capacitors $C_1$, $C_2$ during a transition of the first clock signal CLK1. Absent compensation, the charge can contribute to an input bias current of the electronic circuit 10.

The illustrated charge compensation circuit 4 can be used to provide charge compensation to cancel or compensate for charge injection through the first and second parasitic capacitors $C_1$, $C_2$. For example, the charge compensation circuit 4 can be used to generate a first amount of charge at the input circuit's first input and to generate a second amount of charge at the input circuit's second input to compensate for charge injection associated with transitions of the first clock signal CLK1.

In certain implementations, charge control signal QCNTL can be used to configure the charge compensation circuit 4 to generate different amounts of charge at the input circuit's first input and at the input circuit's second input. For example, in one embodiment, the charge compensation circuit 4 can be used to compensate for differences in the first and second parasitic capacitors $C_1$, $C_2$, such as a capacitance difference associated with manufacturing variation and/or a systematic offset arising from a circuit layout. However, other configurations are possible, such as implementations in which the charges generated by the charge compensation circuit 4 at the input circuit's first and second inputs can be substantially equal, such as in configurations where the first and second parasitic capacitors $C_1$, $C_2$ have substantially equal capacitances.

The charge compensation circuit 4 can be configured to generate charges of opposite polarity in response to rising and falling edges of the first clock signal CLK1. For example, a polarity of the charge injected by the first and second parasitic capacitors $C_1$, $C_2$ can depend on whether the first clock signal's transition is a rising edge or a falling edge, and thus a polarity of the charge generated by the charge compensation circuit 4 to compensate for a rising edge of the first clock signal CLK1 can be opposite of that of a polarity of the charge generated to compensate for a falling edge of the first clock signal CLK1.

The amount of charge compensation provided by the charge compensation circuit 4 can be controlled using the charge control signal QCNTL. In the illustrated configuration, the charge control signal QCNTL is generated by the programmable memory 5, and can comprise a multi-bit digital signal that controls a magnitude of a first charge generated at the charge compensation circuit's first output and a magnitude of a second charge generated at the charge compensation circuit's second output. In one embodiment, the charge control signal QCNTL is a digital signal comprising n bits, with n selected to be in the range of about 6 bits to about 12 bits. However, other values of n are possible. Additionally, in certain embodiments, the charge control signal QCNTL comprises an analog signal, such as an analog voltage or current.

In certain configurations, a value of the charge control signal QCNTL can be determined during factory test, and can be retained in the programmable memory 5. For example, a magnitude of the electronic circuit's input bias current can be observed during testing using automatic test equipment (ATE), and the value of the charge control signal QCNTL can be selected based on the observations. For instance, a value of the charge control signal QCNTL associated with the smallest observed input bias current can be stored in the programmable memory 5.

In certain configurations, the programmable memory 5 can include a non-volatile memory, including, for example, a flash memory, a read-only memory (ROM), a memory implemented using fuses and/or anti-fuses, and/or a magnetic storage device. However, other configurations are possible, such as implementations in which the programmable memory 5 includes a volatile memory that is programmed with data corresponding to the charge control signal's selected value during power-up.

The first and second input switches 1, 2 can be implemented using a wide variety of structures, including, for example, field-effect transistors (FETs). In one embodiment, the first and second input switches are implemented as metal oxide semiconductor (MOS) transistors. It will be understood that these MOS transistors can have gates made out of materials other than metals, such as polycrystalline silicon, and can have dielectric "oxide" regions made from dielectrics other than silicon oxide, such as from silicon nitride or high-k dielectrics.

In the illustrated configuration, the charge compensation circuit 4 receives the second clock signal CLK2. In one embodiment, the second clock signal CLK2 can correspond to an inverted version of the first clock signal CLK1. However, other configurations are possible. For example, in another embodiment the first and second input switches 1, 2 and the charge compensation circuit 4 operate using a common clock signal. In yet another embodiment, the second clock signal CLK2 has a frequency that is a multiple of a frequency of the first clock signal CLK1. For example, the second clock signal CLK2 can have a frequency that is about two times that of the first clock signal CLK1, about three times that of the first clock signal CLK1, or about four or more times that of the first clock signal CLK1.

Although FIG. 1A illustrates an electronic circuit that includes two input switches, the teachings herein are applicable to configurations including additional input switches.

Figure 1B:
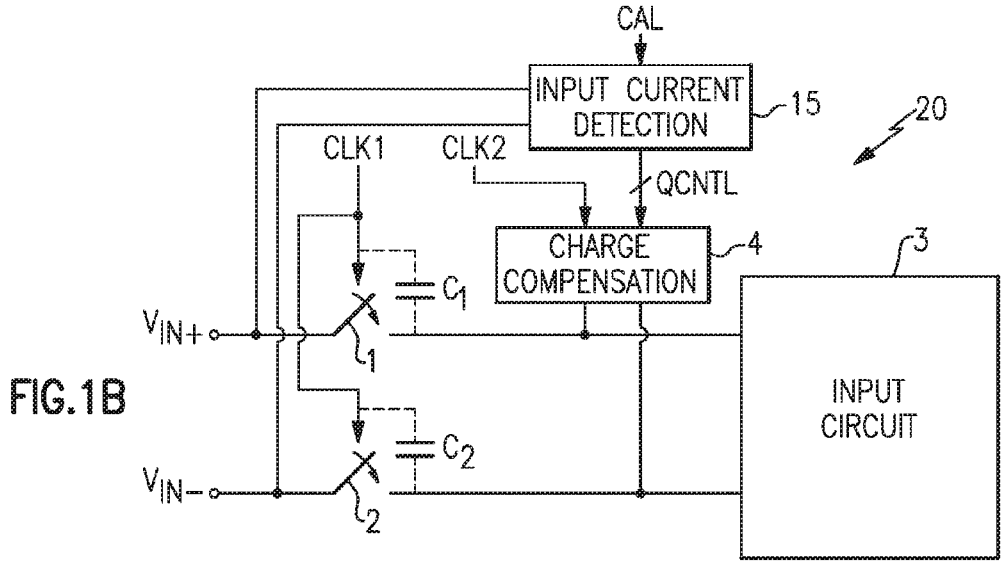
FIG. 1B is a schematic diagram of another embodiment of an electronic circuit.

FIG. 1B is a schematic diagram of another embodiment of an electronic circuit 20. The electronic circuit 20 includes the non-inverting input voltage terminal $V_{IN+}$, the inverting input voltage terminal $V_{IN-}$, the first input switch 1, the second input switch 2, the input circuit 3, and the charge compensation circuit 4, which can be as described earlier. The illustrated electronic circuit 20 further includes an input current detection circuit 15, which receives a calibration control signal CAL.

As shown in FIG. 1B, the input current detection circuit 15 includes a first input electrically connected to the non-inverting input voltage terminal $V_{IN+}$ and to the switch input of the first input switch 1, a second input electrically connected to the inverting input voltage terminal $V_{IN-}$ and to the switch input of the second input switch 2, and an output that generates the charge control signal QCNTL. In certain implementations, the input current detection circuit 15 can be used to determine a setting or value of the charge control signal QCNTL in response to activation of the calibration control signal CAL.

For example, in one embodiment, the input current detection circuit 15 includes a state machine that sequences the charge control signal QCNTL through multiple values. Additionally, the input current detection circuit 15 can control a voltage level of the non-inverting and inverting input voltage terminals $V_{IN+}$, $V_{IN-}$ during calibration, and can observe the electronic circuit's input bias current for different test values of the charge control signal QCNTL. Additionally, the input current detection circuit 15 can set the charge control signal QCNTL based on the observations, such as by setting the charge control signal QCNTL to a setting associated with the smallest observed input bias current magnitude.

Additional details of the electronic circuit 20 can be similar to those described earlier.

Figure 1C:
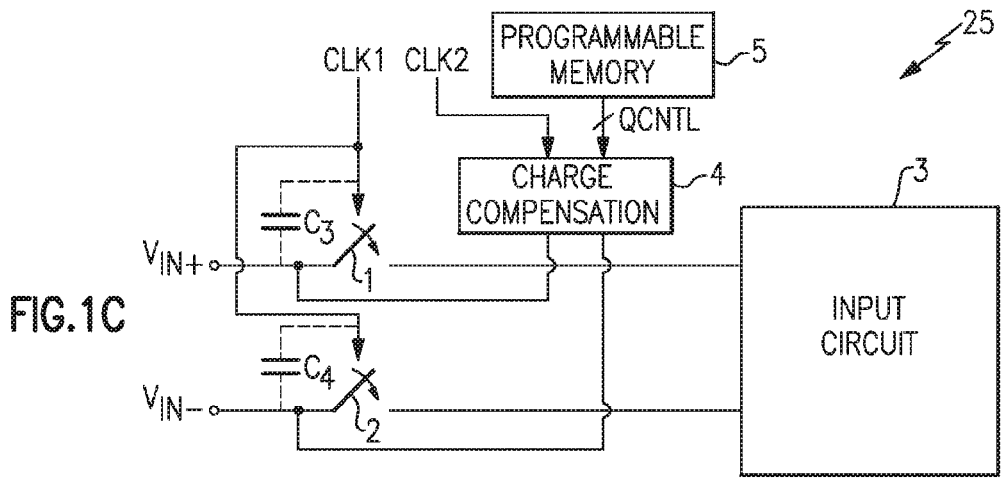
FIG. 1C is a schematic diagram of another embodiment of an electronic circuit.

FIG. 1C is a schematic diagram of another embodiment of an electronic circuit 25.

The electronic circuit 25 of FIG. 1C is similar to the electronic circuit 10 of FIG. 1A, except that the electronic circuit 25 illustrates a configuration in which the first output of the charge compensation circuit 4 is electrically connected to the non-inverting input voltage terminal $V_{IN+}$, and in which the second output of the charge compensation circuit 4 is electrically connected to the inverting input voltage terminal $V_{IN-}$.

As shown in FIG. 1C, a third parasitic capacitor $C_3$ can be present between the control input of the first input switch 1 and the non-inverting input voltage terminal $V_{IN+}$. Additionally, a fourth parasitic capacitor $C_4$ can be present between the control input of the second input switch 2 and the inverting input voltage terminal $V_{IN-}$.

The illustrated charge compensation circuit 4 can be used to provide charge compensation to cancel or compensate for charge injection through the third and fourth parasitic capacitors $C_3$, $C_4$. For example, the charge compensation circuit 4 can be used to generate a first amount of charge at the non-inverting input voltage terminal $V_{IN+}$ and to generate a second amount of charge at the inverting input voltage terminal $V_{IN-}$ to compensate for charge injection associated with transitions of the first clock signal CLK1.

Figure 2:
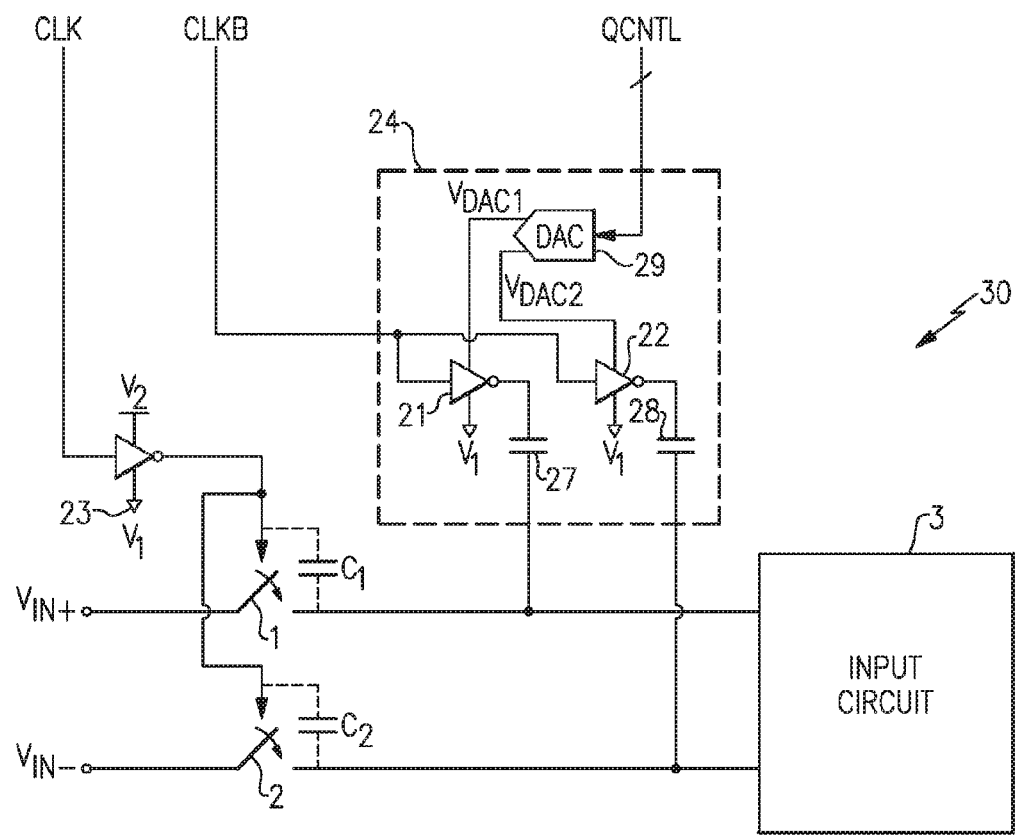
FIG. 2 is a schematic diagram of another embodiment of an electronic circuit.

FIG. 2 is a schematic diagram of another embodiment of an electronic circuit 30. The electronic circuit 30 includes the non-inverting input voltage terminal $V_{IN+}$, the inverting input voltage terminal $V_{IN-}$, the first input switch 1, the second input switch 2, and the input circuit 3, which can be as described earlier. The illustrated electronic circuit 30 further includes a clock inverter 23 and a charge compensation circuit 24.

In the illustrated configuration, the clock inverter 23 includes an input that receives a non-inverted clock signal CLK and an output electrically connected to the control inputs of the first and second input switches 1, 2. The illustrated clock inverter 23 is powered using a first voltage $V_1$ and a second voltage $V_2$. Although the first and second input switches 1, 2 are illustrated as being controlled by a clock signal generated by a clock inverter, the teachings herein are applicable to configurations using other circuitry, including, for example, other logic circuits.

The illustrated charge compensation circuit 24 includes a first charge compensation inverter 21, a second charge compensation inverter 22, a first charge compensation capacitor 27, a second charge compensation capacitor 28, and a digital-to-analog converter (DAC) 29. Although the illustrated charge compensation circuit uses charge compensation inverters, the teachings herein are applicable to configurations using other circuitry, including, for example, other logic circuits.

The DAC 29 receives the charge control signal QCNTL, and generates a first DAC voltage $V_{DAC1}$ and a second DAC voltage $V_{DAC2}$ based on a value of the charge control signal QCNTL. The first charge compensation inverter 21 includes an input that receives an inverted clock signal CLKB, and an output electrically connected to a first end of the first charge compensation capacitor 27. The first charge compensation capacitor 27 further includes a second end electrically connected to the first input of the input circuit 3. The second charge compensation inverter 22 includes an input that receives the inverted clock signal CLKB, and an output electrically connected to a first end of the second charge compensation capacitor 28. The second charge compensation capacitor 28 further includes a second end electrically connected to the second input of the input circuit 3. As shown in FIG. 2, the first charge compensation inverter 21 is powered using the first voltage $V_1$ and the first DAC voltage $V_{DAC1}$, and the second charge compensation inverter 22 is powered using the first voltage $V_1$ and the second DAC voltage $V_{DAC2}$.

In the illustrated configuration, the output of the clock inverter 23 can transition from about the first voltage $V_1$ to about the second voltage $V_2$ in response to a falling edge of the non-inverted clock signal CLK, and can transition from about the second voltage $V_2$ to about the first voltage $V_1$ in response to a rising edge of the non-inverted clock signal CLK. Accordingly, the first input switch 1 can inject a charge about equal to $C_1^*(V_2-V_1)$ in response to a falling edge of the non-inverted clock signal CLK, and can inject a charge about equal to $C_1^*(V_1-V_2)$ in response to a rising edge of the non-inverted clock signal CLK. Additionally, the second input switch 2 can inject a charge about equal to $C_2^*(V_2-V_1)$ in response to a falling edge of the non-inverted clock signal CLK, and can inject a charge about equal to $C_2^*(V_1-V_2)$ in response to a rising edge of the non-inverted clock signal CLK.

The illustrated charge compensation circuit 24 can be used to compensate for the charge injection associated with the first and second input switches 1, 2. For example, the inverted clock signal CLKB can be inverted relative to the non-inverted clock signal CLK, and the charge compensation circuit 24 can generate charges that compensate input switch charge injection when the non-inverted clock signal CLK transitions.

For instance, the output of the first charge compensation inverter 21 can transition from about the first voltage $V_1$ to about the first DAC voltage $V_{DAC1}$ when the non-inverted clock signal CLK is rising and the inverted clock signal CLKB is falling, and can transition from about the first DAC voltage $V_{DAC1}$ to about the first voltage $V_1$ when the non-inverted clock signal CLK is falling and the inverted clock signal CLKB is rising. Additionally, the output of the second charge compensation inverter 22 can transition from about the first voltage $V_1$ to about the second DAC voltage $V_{DAC2}$ when the non-inverted clock signal CLK is rising and the inverted clock signal CLKB is falling, and can transition from about the second DAC voltage $V_{DAC2}$ to about the first voltage $V_1$ when the non-inverted clock signal CLK is falling and the inverted clock signal CLKB is rising.

Furthermore, when the capacitances of the first and second compensation capacitors 27, 28 are about equal with a value $C_{COMP}$, the charge compensation circuit 24 can inject a charge about equal to $C_{COMP}^*(V_{DAC1}-V_1)$ at the input circuit's first input and a charge about equal to $C_{COMP}^*(V_{DAC2}-V_1)$ at the input circuit's second input when the non-inverted clock signal CLK rises. Additionally, the charge compensation circuit 24 can inject a charge about equal to $C_{COMP}^*(V_1-V_{DAC1})$ at the input circuit's first input and a charge about equal to $C_{COMP}^*(V_1-V_{DAC2})$ at the input circuit's second input when the non-inverted clock signal CLK falls.

The DAC 29 can control voltage levels of the first and second DAC voltages $V_{DAC1}$, $V_{DAC2}$ based on the charge control signal QCNTL. In one embodiment, the charge control signal QCNTL can have a value selected such that $|C_{COMP}^*(V_{DAC1}-V_1)|$ is about equal to $|C_1^*(V_2-V_1)|$, and such that $|C_{COMP}^*(V_{DAC2}-V_1)|$ is about equal to $|C_2^*(V_2-V_1)|$. Selecting the value of the charge control signal QCNTL in this manner can result in the charge compensation circuit 24 substantially canceling the charge injection through the first and second input switches 1, 2.

Additional details of the electronic circuit 30 can be similar to those described earlier.

Figure 3A:
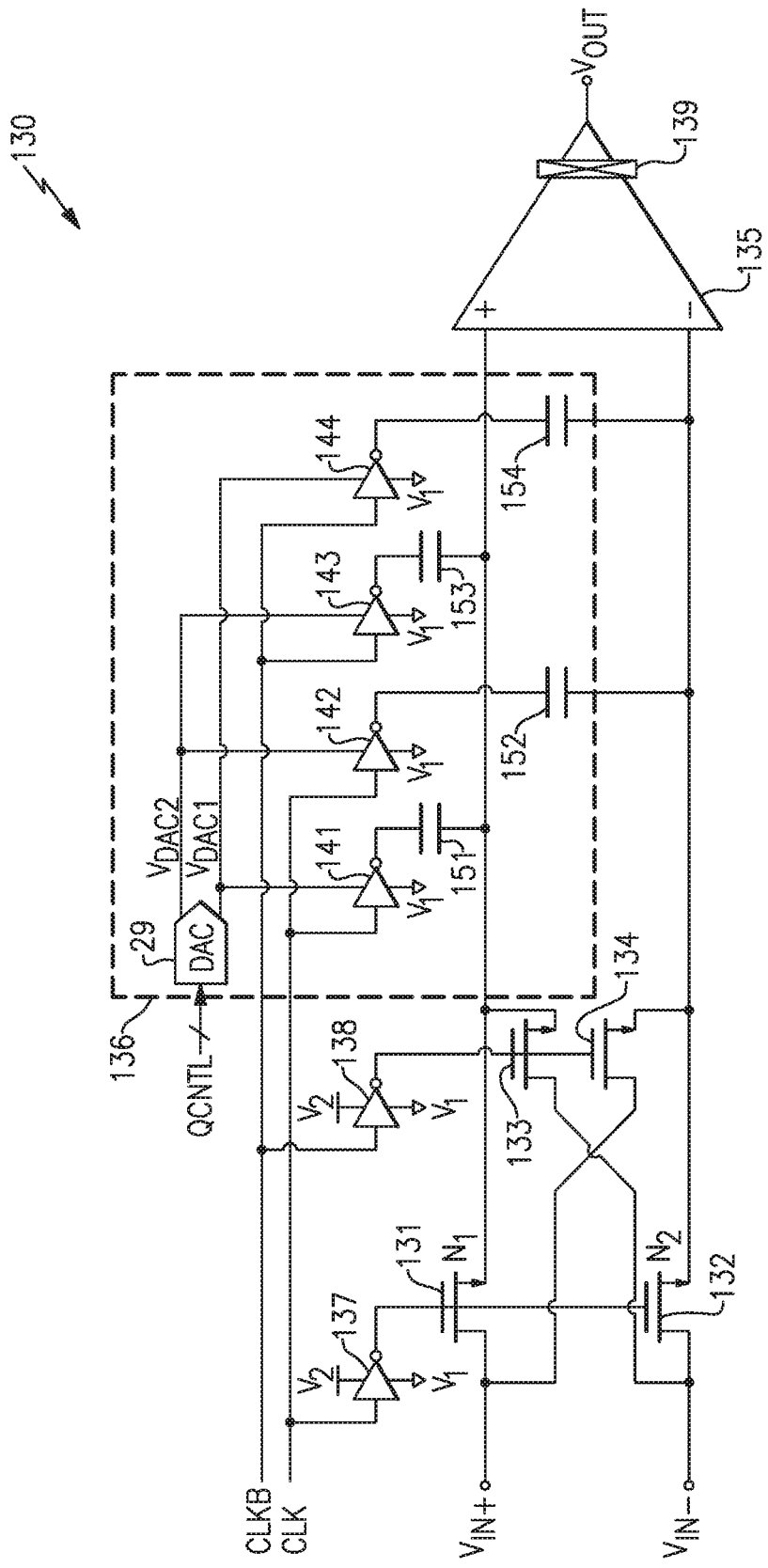
FIG. 3A is a schematic diagram of one embodiment of a chopper amplifier.

FIG. 3A is a schematic diagram of one embodiment of a chopper amplifier 130. The chopper amplifier 130 includes a non-inverting input voltage terminal $V_{IN+}$, an inverting input voltage terminal $V_{IN-}$, an output voltage terminal $V_{OUT}$, a first input FET 131, a second input FET 132, a third input FET 133, a fourth input FET 134, an amplification circuit 135, a charge compensation circuit 136, a first clock inverter 137, and a second clock inverter 138. The chopper amplifier 130 receives a non-inverted clock signal CLK, an inverted clock signal CLKB, and a charge control signal QCNTL.

The first clock inverter 137 includes an input that receives the non-inverted clock signal CLK and an output electrically connected to a gate of the first input FET 131 and to a gate of the second input FET 132. The first input FET 131 further includes a drain electrically connected to the non-inverting input voltage terminal $V_{IN+}$ and a source electrically connected to a first input of the amplification circuit 135 at a first node $N_1$. The second input FET 132 further includes a drain electrically connected to the inverting input voltage terminal $V_{IN-}$ and a source electrically connected to a second input of the amplification circuit 135 at a second node $N_2$. The amplification circuit 135 further includes an output electrically connected to the output voltage terminal $V_{OUT}$. The second clock inverter 138 includes an input that receives the inverted clock signal CLKB and an output electrically connected to a gate of the third input FET 133 and to a gate of the fourth input FET 134. The third input FET 133 further includes a drain electrically connected to the inverting input voltage terminal $V_{IN-}$ and a source electrically connected to the first node $N_1$. The fourth input FET 134 further includes a drain electrically connected to the non-inverting input voltage terminal $V_{IN+}$ and a source electrically connected to the second node $N_2$. The first and second clock inverters 137, 138 are powered using the first voltage $V_1$ and the second voltage $V_2$.

In the illustrated configuration, the charge compensation circuit 136 includes a first charge compensation inverter 141, a second charge compensation inverter 142, a third charge compensation inverter 143, a fourth charge compensation inverter 144, a DAC 29, a first charge compensation capacitor 151, a second charge compensation capacitor 152, a third charge compensation capacitor 153, and a fourth charge compensation capacitor 154. The DAC 29 receives the charge control signal QCNTL, and generates a first DAC voltage $V_{DAC1}$ and a second DAC voltage $V_{DAC2}$.

The first charge compensation inverter 141 includes an input that receives the non-inverted clock signal CLK and an output electrically connected to a first end of the first charge compensation capacitor 151. The first charge compensation capacitor 151 further includes a second end electrically connected to the first input of the amplification circuit 135 at the first node $N_1$. The second charge compensation inverter 142 includes an input that receives the non-inverted clock signal CLK and an output electrically connected to a first end of the second charge compensation capacitor 152. The second charge compensation capacitor 152 further includes a second end electrically connected to the second input of the amplification circuit 135 at the second node $N_2$. The third charge compensation inverter 143 includes an input that receives the inverted clock signal CLKB and an output electrically connected to a first end of the third charge compensation capacitor 153. The third charge compensation capacitor 153 further includes a second end electrically connected to the first node $N_1$. The fourth charge compensation inverter 144 includes an input that receives the inverted clock signal CLKB and an output electrically connected to a first end of the fourth charge compensation capacitor 154. The fourth charge compensation capacitor 154 further includes a second end electrically connected to the second node $N_2$.

The illustrated chopper amplifier 130 can be used to perform a chopping operation on a differential input signal received between the non-inverting and inverting input voltage terminals $V_{IN+}$, $V_{IN-}$.

For example, during a first phase of the chopper amplifier 130, the non-inverted and inverted clock signals CLK, CLKB can be used to turn on the first and second input FETs 131, 132 and to turn off the third and fourth input FETs 133, 134, thereby providing the differential input signal to the amplification circuit 135. Additionally, during a second phase of the chopper amplifier 130, the non-inverted and inverted clock signals CLK, CLKB can be used to turn off the first and second input FETs 131, 132 and to turn on the third and fourth input FETs 133, 134, thereby providing the differential input signal to the amplification circuit 135 with inverted polarity.

The switching of the first to fourth input FETs 131-134 can operate to modulate or up-shift the frequency spectrum of the differential input signal by the clock signals' chopping frequency, and output chopping switches 139 of the amplification circuit 135 can be used demodulate or down-shift the frequency spectrum of the amplified input signal by the chopping frequency. Since the amplification circuit 135 is positioned in the chopper amplifier's signal path after the first to fourth input FETs 131-134, the amplifier's input offset should not be modulated by the switching of the first to fourth input FETs 131-134. Rather, the amplifier's input offset can be separated in frequency from the differential input signal, and thus can be removed by filtering.

In response to transitions of the non-inverted clock signal CLK, charge can be injected through parasitic capacitors associated with the first and second input FETs 131, 132 onto the first and second nodes $N_1$, $N_2$. The parasitic capacitors can be associated with, for example, gate-to-source capacitances. Similarly, in response to transitions of the inverted clock signal CLKB, charge can be injected through parasitic capacitors associated with the third and fourth input FETs 133, 134 onto the first and second nodes $N_1$, $N_2$.

In certain configurations, the first and second input FETs 131, 132 are implemented to have about a same width and length as the third and fourth input FETs 133, 134. Since the gates of the first and second input FETs 131, 132 are controlled with a clock signal of inverted polarity relative to the clock signal used to control the gates of the third and fourth input FETs 133, 134, charge injected by the first and second input FETs 131, 132 can be canceled in part by the charge injected by the third and fourth input FETs 133, 134. Nevertheless, absent compensation, capacitance mismatch between the first and second input FETs 131, 132 and the third and fourth input FETs 133, 134 can result in a net positive or negative charge injection.

The charge compensation circuit 136 can be used to compensate for charge injection and charge injection mismatch through the first to fourth input FETs 131-134 associated with transitions of the non-inverted and inverted clock signals CLK, CLKB, thereby reducing the amplifier's input bias current.

As shown in FIG. 3A, the first and fourth charge compensation inverters 141, 144 are powered using the first voltage $V_1$ and the first DAC voltage $V_{DAC1}$. Additionally, the second and third charge compensation inverters 142, 143 are powered using the first voltage $V_1$ and the second DAC voltage $V_{DAC2}$. Additionally, the charge control signal QCNTL can be used to control the voltage levels of the first and second DAC voltages $V_{DAC1}$, $V_{DAC2}$, thereby controlling an amount of charge injected onto the first and second nodes $N_1$, $N_2$ by the charge compensation circuit 136.

For example, in one embodiment, a first parasitic capacitance between the gate of the first input FET 131 and the first input of the amplification circuit 135 is about equal to $C_1$, and a second parasitic capacitance between the gate of the second input FET 132 and the second input of the amplification circuit 135 is about equal to $C_1 + \Delta C_{21}$. Additionally, a third parasitic capacitance between the gate of the third input FET 133 and the first input of the amplification circuit 135 is about equal to $C_3$, and a forth parasitic capacitance between the gate of the forth input FET 134 and the second input of the amplification circuit 135 is about equal to $C_3 + \Delta C_{43}$. Additionally, magnitudes of original input bias currents $I_{ORIG+}$ and $I_{ORIG-}$ of the chopper amplifier at the non-inverting input terminal $V_{IN+}$ and the inverting input terminal $V_{IN-}$, respectively, before compensation are approximated by Equation 1 below, where $f_{chop}$ is the frequency of the non-inverted and inverted clock signals CLK, CLKB.

$$I_{ORIG+} \sim = 2f_{chop} * (\Delta C_{43} - \Delta C_{21}) * (V_2 - V_1)$$

$$I_{ORIG-} \sim = -2f_{chop} * (\Delta C_{43} - \Delta C_{21}) * (V_2 - V_1) \quad \text{Equation 1}$$

Additionally, magnitudes of compensation currents $I_{COMP+}$, $I_{COMP-}$ generated at the non-inverting input terminal $V_{IN+}$ and the inverting input terminal $V_{IN-}$ of the chopper amplifier by the charge compensation circuit 136 can be approximated by Equation 2 below, wherein $C_{151}$ is a capacitance of the first charge compensation capacitor 151, $C_{152}$ is a capacitance of the second charge compensation capacitor 152, $C_{153}$ is a capacitance of the third charge compensation capacitor 153, and $C_{154}$ is a capacitance of the fourth charge compensation capacitor 154.

$$I_{COMP+} \sim = 2 f_{chop} * \left\{ \left( \frac{C_{151} + C_{154}}{2} \right) * (V_{DAC1} - V_1) - \left( \frac{C_{152} + C_{153}}{2} \right) * (V_{DAC2} - V_1) \right\}$$

$$I_{COMP-} \sim = -2 f_{chop} * \left\{ \left( \frac{C_{151} + C_{154}}{2} \right) * (V_{DAC1} - V_1) - \left( \frac{C_{152} + C_{153}}{2} \right) * (V_{DAC2} - V_1) \right\} \quad \text{Equation 2}$$

Accordingly, the illustrated charge compensation circuit 136 can be used to compensate for a charge injection mismatch between charges injected by the first and second input FETs 131, 132, relative to a charge injection mismatch between charges injected by the third and fourth input FETs 133, 134.

In certain configurations, a parasitic capacitance mismatch $\Delta C_{21}$ between the first and second input FETs 131, 132, relative to a parasitic capacitance mismatch $\Delta C_{43}$ between the third and fourth input FETs 133, 134 can be relatively small, compared to a nominal parasitic capacitances $C_1$, $C_3$ of the first to fourth input FETs 131-134. Additionally, in certain configurations, the capacitance of the first to fourth charge compensation capacitors 151-154 can be smaller than the nominal parasitic capacitances $C_1$, $C_3$ of the first to fourth input FETs 131-134, such that manufacturing variation of the first to fourth charge compensation capacitors 151-154 has a relatively small impact on the performance of the charge compensation circuit 136.

Figure 3B:
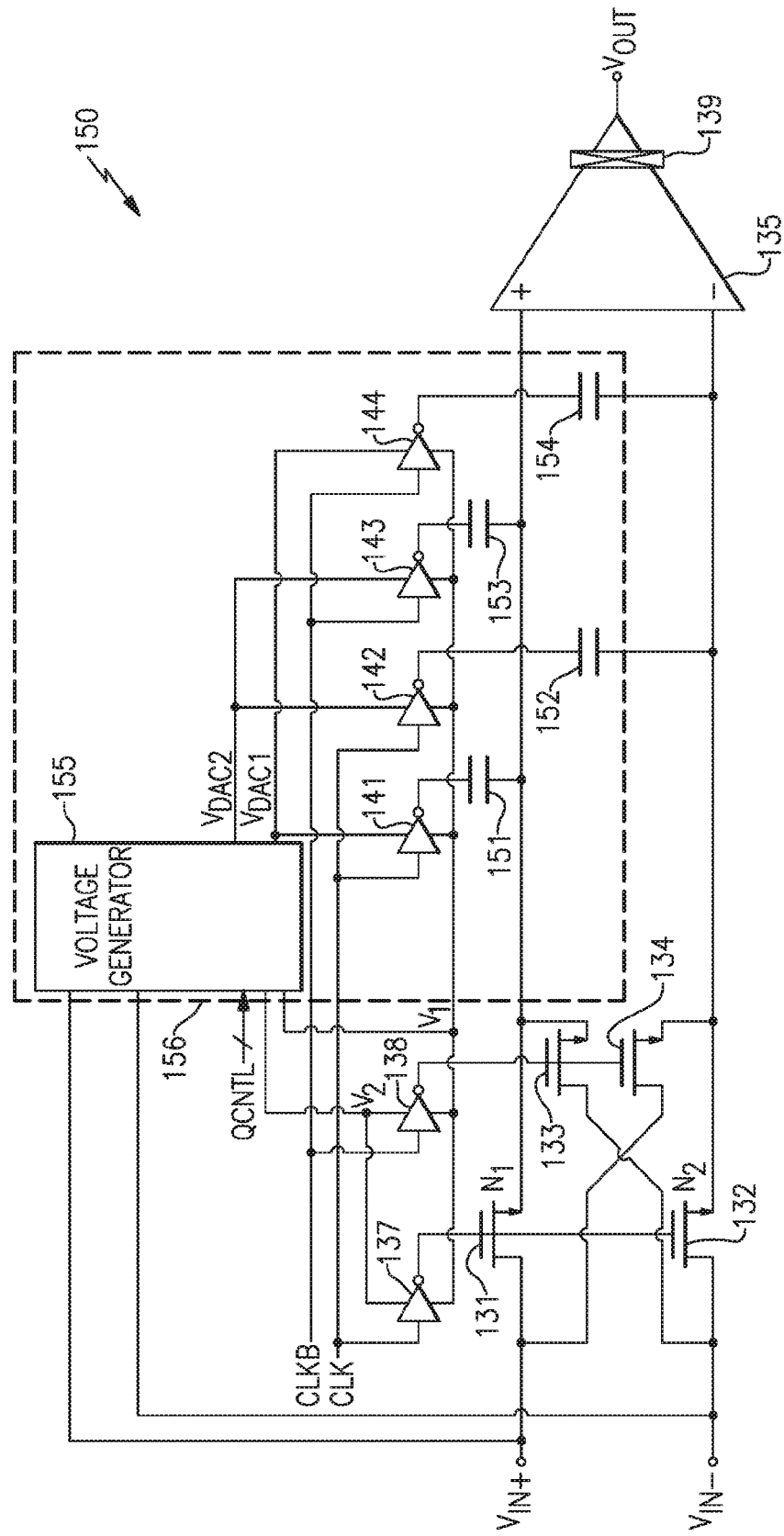
FIG. 3B is a schematic diagram of another embodiment a chopper amplifier.

FIG. 3B is a schematic diagram of another embodiment a chopper amplifier 150. The chopper amplifier 150 of FIG. 3B is similar to the chopper amplifier 130 of FIG. 3A, except that chopper amplifier 150 of FIG. 3B includes a charge compensation circuit 156 implemented in a different arrangement relative to the charge compensation circuit 136 of FIG. 3A.

For example, the charge compensation circuit 156 of FIG. 3B includes a voltage generation circuit 155, first to fourth charge compensation inverters 141-144, and first to fourth charge compensation capacitors 151-154. As shown in FIG. 3B, the voltage generation circuit 155 includes a first input electrically connected to the non-inverting input voltage terminal $V_{IN+}$, a second input electrically connected to the inverting input voltage terminal $V_{IN-}$, and a third input that receives the charge control signal QCNTL. Additionally, the voltage generation circuit 155 includes a first output that generates the first voltage $V_1$, a second output that generates the second voltage $V_2$, a third output that generates the first DAC voltage $V_{DAC1}$, and a fourth output that generates the second DAC voltage $V_{DAC2}$.

The voltage generation circuit 155 can be used to control a voltage level of the first and second voltages $V_1$, $V_2$ based on a common-mode voltage of the non-inverting and inverting input voltage terminals $V_{IN+}$, $V_{IN-}$. In certain implementations the first and second voltages $V_1$, $V_2$ track the common-mode voltage of the non-inverting and inverting input voltage terminals $V_{IN+}$, $V_{IN-}$. For example, in one embodiment, the voltage level of the first voltage $V_1$ is about equal to the common-mode voltage and the voltage level of the second voltage $V_2$ is about equal to the common-mode voltage plus a fixed voltage $V_S$.

Additionally, the voltage generation circuit 155 can be used to control a voltage level of the DAC voltage $V_{DAC1}$ and a voltage level of the second DAC voltage $V_{DAC2}$ based on the charge control signal QCNTL and on the voltage levels of the first and second voltages $V_1$, $V_2$.

The illustrated configuration advantageously controls a voltage level of the power supplies used by the first and second clock inverters 137, 138 based on the amplifier's input common-mode voltage. Configuring a chopper amplifier in this manner can aid in maintaining a charge injection associated with the first to fourth input FETs 131-134 relatively constant with changes in input common-mode voltage. Additionally, the illustrated configuration controls a voltage level of the power supplies used by the first to fourth charge compensation inverters 141-144 based on both the charge control signal QCNTL and the amplifier's input common-mode voltage.

Accordingly, the illustrated charge compensation scheme can be used to provide charge compensation to the first to fourth input FETs 131-134, and the charge compensation can be maintained over a wide range of input common-mode voltage levels. Additional details of the chopper amplifier 150 can be similar to those described earlier.

Figure 4:
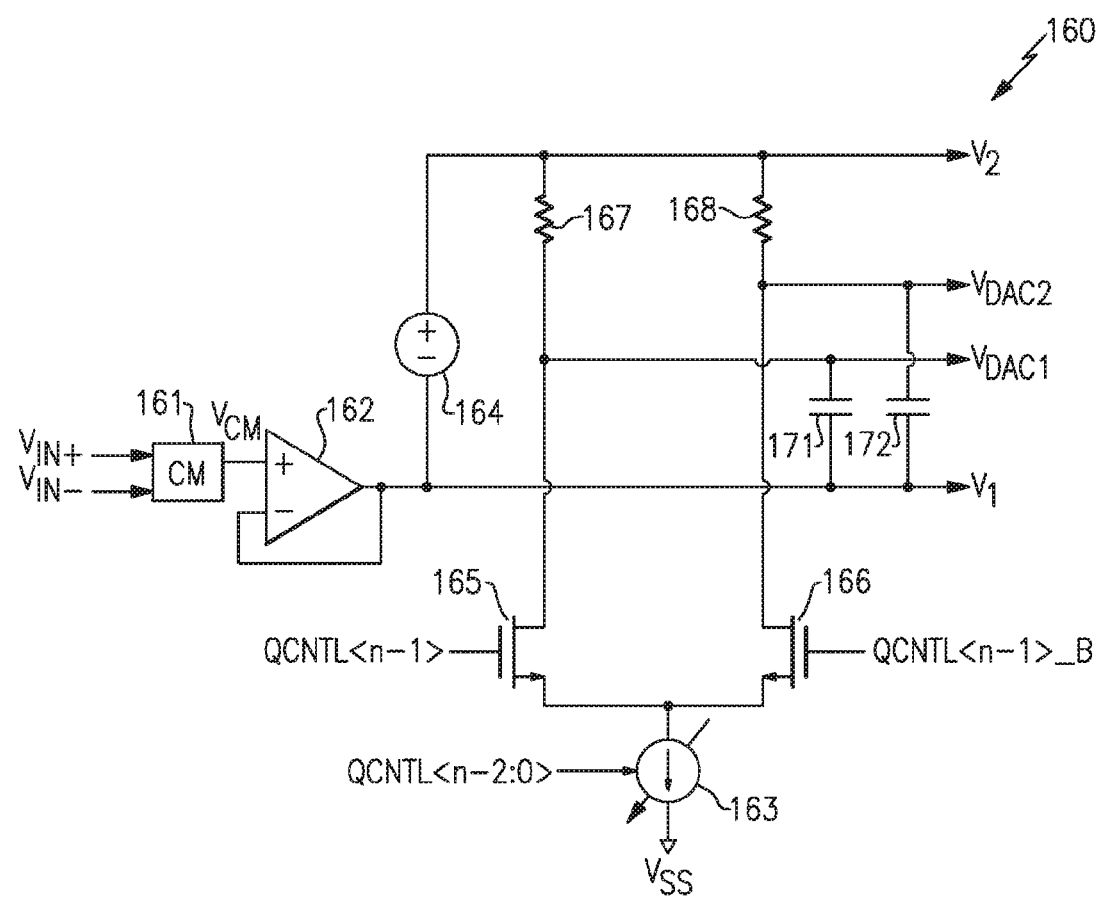
FIG. 4 is a schematic diagram of one embodiment of a voltage generation circuit that can be used in the chopper amplifier of FIG. 3B.

FIG. 4 is a schematic diagram of one embodiment of a voltage generation circuit 160 that can be used in the chopper amplifier 150 of FIG. 3B. The illustrated voltage generation circuit 160 includes a common-mode voltage detection circuit 161, a buffer circuit 162, a programmable current source 163, a voltage source 164, a first current steering FET 165, a second current steering FET 166, a first resistor 167, a second resistor 168, a first capacitor 171, and a second capacitor 172.

As shown in FIG. 4, the common-mode voltage detection circuit 161 includes a first input electrically connected to the non-inverting input voltage terminal $V_{IN+}$, a second input electrically connected to the inverting input voltage terminal $V_{IN-}$, and an output configured to generate a common-mode voltage $V_{CM}$. The buffer circuit 162 includes a non-inverting input that receives the common-mode voltage $V_{CM}$, an inverting input, and an output electrically connected to the inverting input to provide feedback. The output of the buffer circuit 162 generates the first voltage $V_1$, which can have a voltage level about equal to that of the common-mode voltage $V_{CM}$.

The voltage source 164 is electrically connected between the first voltage $V_1$ and the second voltage $V_2$, and can be used to control the voltage level of the second voltage $V_2$ relative to the voltage of the first voltage $V_1$. When the voltage source 164 has a value $V_S$, the second voltage $V_2$ generated by the voltage generation circuit 160 can have a voltage level of about $V_S+V_{CM}$.

In the illustrated configuration, the charge control signal QCNTL<n−1:0> corresponds to a digital signal comprising n bits, where n is an integer greater than or equal to 2. As persons having ordinary skill in the art will appreciate, a digital signal X of n bits can be represented as a vector of bits, which can be labeled X<0>, X<1>, ... X<n−1>, with a range of bits between the ith bit and the jth bit being labeled as X<i:j>.

The programmable current source 163 includes a control input that receives bits QCNTL<n−2:0> of the charge control signal QCNTL<n−1:0>. The programmable current source 163 includes a first end electrically connected to a power low supply voltage $V_{SS}$, and a second end electrically connected to a source of the first current steering FET 165 and to a source of the second current steering FET 166. The first current steering FET 165 further includes a gate that receives a bit QCNTL<n−1> of the charge control signal QCNTL<n−1:0>. Additionally, the second current steering FET 166 further includes a gate that receives an inverted version of the bit QCNTL<n−1> or QCNTL<n−1>_B. Although FIG. 4 illustrates a configuration in which a most significant bit (MSB) of the charge control signal QCNTL<n−1:0> is used to control the gates of the first and second current steering FETs 165, 166 the teachings herein are applicable to other configurations.

The first resistor 167 includes a first end electrically connected to the second voltage $V_2$ and a second end electrically connected to a drain of the first current steering FET 165 at a node configured to generate the first DAC voltage $V_{DAC1}$. The second resistor 168 includes a first end electrically connected to the second voltage $V_2$ and a second end electrically connected to a drain of the second current steering FET 166 at a node configured to generate the second DAC voltage $V_{DAC2}$. The first capacitor 171 is electrically connected between the first DAC voltage $V_{DAC1}$ and the first voltage $V_1$, and the second capacitor 172 is electrically connected between the second DAC voltage $V_{DAC2}$ and the first voltage $V_1$. The first and second capacitors 171, 172 can be used to stabilize a voltage level of the first and second DAC voltages $V_{DAC1}$, $V_{DAC2}$. For example, the first and second capacitors 171, 172 can be used to limit a voltage change of the first and second DAC voltages $V_{DAC1}$, $V_{DAC2}$ when circuitry powered using the DAC voltages is active.

The charge control signal QCNTL<n−1:0> can be used to control a voltage level of the first DAC voltage $V_{DAC1}$ and a voltage level of the second DAC voltage $V_{DAC2}$ relative to the voltage levels of the first and second voltages $V_1$, $V_2$.

For example, in the illustrated configuration, the bits QCNTL<n−2:0> of the charge control signal QCNTL<n−1:0> can be used to control a magnitude of the programmable current generated by the programmable current source 163, and the bit QCNTL<n−1> of the charge control signal QCNTL<n−1:0> can be used to control whether the programmable current flows through the first resistor 167 or through the second resistor 168. For example, when the bit QCNTL<n−1> of the charge control signal is logically low, the first DAC voltage $V_{DAC1}$ can have a voltage about equal to that of the second voltage $V_2$, and the second DAC voltage $V_{DAC2}$ can have a voltage about equal to $V_2-I_{PRGM}*R$, where R is the resistance of the first and second resistors 167, 168 and $I_{PRGM}$ is the programmable current generated by the programmable current source 163. Additionally, when the bit QCNTL<n−1> of the charge control signal is logically high, the second DAC voltage $V_{DAC2}$ can have a voltage about equal to that of the second voltage $V_2$, and the first DAC voltage $V_{DAC1}$ can have a voltage about equal to $V_2-I_{PRGM}*R$.

Accordingly, the bit QCNTL<n−1> of the charge control signal QCNTL<n−1:0> can be used to control whether the first DAC voltage $V_{DAC1}$ is greater than the second DAC voltage $V_{DAC2}$ or vice versa, thereby controlling charge polarity of charges generated by a charge compensation circuit using the voltage generation circuit 160. Additionally, the magnitude of the charges generated by the charge compensation circuit can be controlled by bits QCNTL<n−2:0> of the charge control signal QCNTL<n−1:0>. However, other configurations are possible.

In one embodiment, the first and second resistors 167, 168 and/or the programmable current source 163 can have a temperature dependence configured to match a temperature dependency of an input bias current of a chopper amplifier absent compensation. Configuring a charge compensation circuit in this manner can aid in providing accurate charge compensation over temperature variation. However, other configurations are possible, such as implementations in which the first and second resistors 167, 168 and/or the programmable current source 163 have other temperature dependencies, including, for example, a relatively small amount of temperature dependency.

Figure 5:
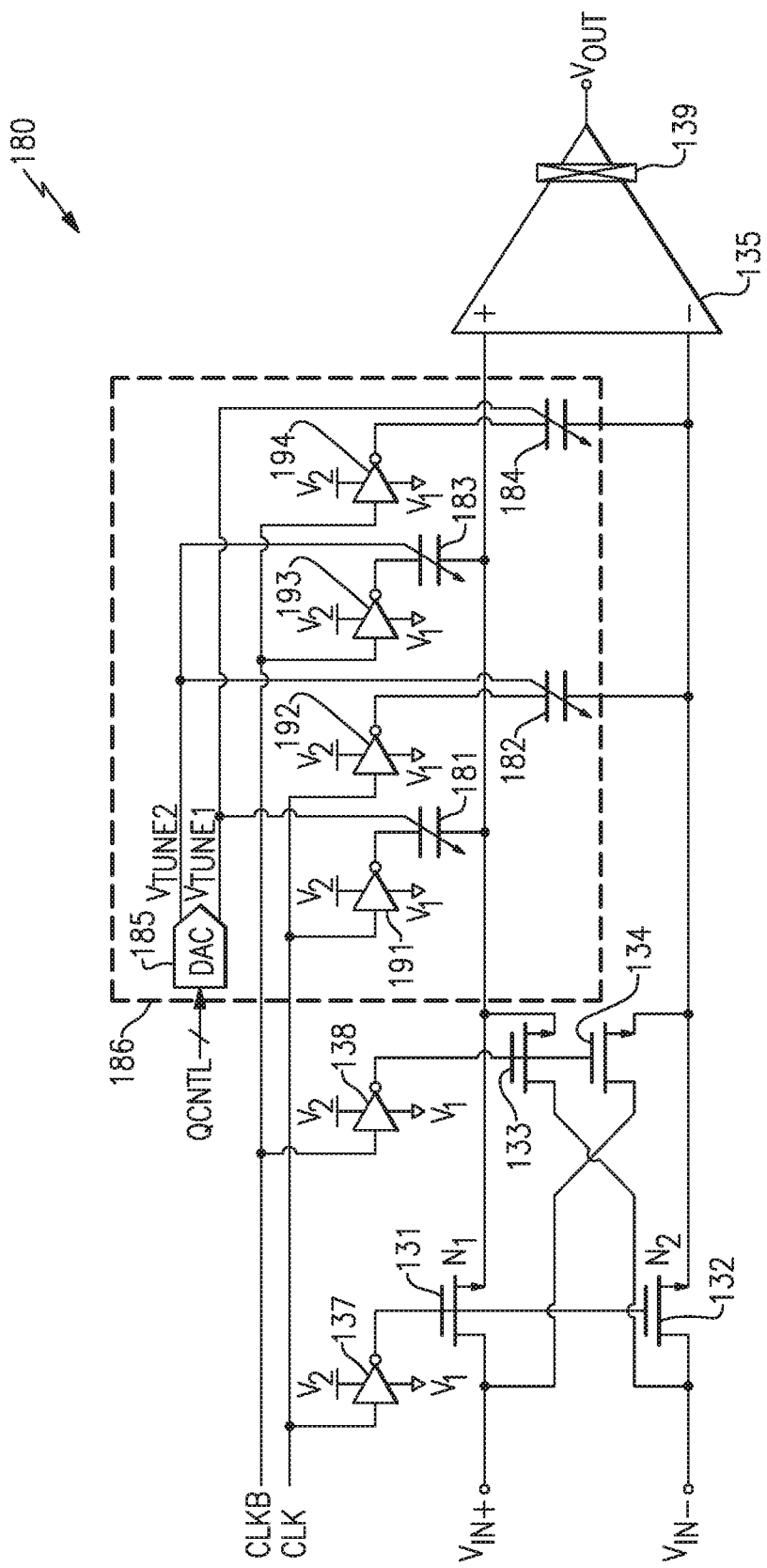
FIG. 5 is a schematic diagram of another embodiment of a chopper amplifier.

FIG. 5 is a schematic diagram of another embodiment of a chopper amplifier 180. The chopper amplifier 180 of FIG. 5 is similar to the chopper amplifier 130 of FIG. 3A, except that chopper amplifier 180 of FIG. 5 includes a charge compensation circuit 186 implemented in a different arrangement relative to the charge compensation circuit 136 of FIG. 3A.

For example, the charge compensation circuit 186 of FIG. 5 includes first to fourth charge compensation inverters 191-194, first to fourth variable capacitors 181-184, and a DAC 185.

As shown in FIG. 5, the DAC 185 receives the charge control signal QCNTL, and generates a first capacitor tuning voltage $V_{TUNE1}$ and a second capacitor tuning voltage $V_{TUNE2}$ based on a value of the charge control signal QCNTL. Additionally, the first charge compensation inverter 191 includes an input that receives the non-inverted clock signal CLK, and an output electrically connected to a first end of the first variable capacitor 181. The first variable capacitor 181 further includes a second end electrically connected to the first input of the amplification circuit 135 at the first node $N_1$, and a capacitance control input that receives the first capacitor tuning voltage $V_{TUNE1}$. Additionally, the second charge compensation inverter 192 includes an input that receives the non-inverted clock signal CLK, and an output electrically connected to a first end of the second variable capacitor 182. The second variable capacitor 182 further includes a second end electrically connected to the second input of the amplification circuit 135 at the second node $N_2$, and a capacitance control input that receives the second capacitor tuning voltage $V_{TUNE2}$. Additionally, the third charge compensation inverter 193 includes an input that receives the inverted clock signal CLKB, and an output electrically connected to a first end of the third variable capacitor 183. The third variable capacitor 183 further includes a second end electrically connected to the first node $N_1$, and a capacitance control input that receives the second capacitor tuning voltage $V_{TUNE2}$. Additionally, the fourth charge compensation inverter 194 includes an input that receives the inverted clock signal CLKB, and an output electrically connected to a first end of the fourth variable capacitor 184. The fourth variable capacitor 184 further includes a second end electrically connected to the second node $N_2$, and a capacitance control input that receives the first capacitor tuning voltage $V_{TUNE1}$. In the illustrated configuration, the first to fourth charge compensation inverters 191-194 are powered using the first and second voltages $V_1$, $V_2$.

In contrast to the charge compensation circuit 136 of FIG. 3A which provides a selectable amount of charge compensation by controlling a voltage difference between voltages used to power the first to fourth charge compensation inverters 141-144, the charge compensation circuit 186 of FIG. 5 provides a selectable amount of charge compensation by controlling capacitances of the first to fourth variable capacitors 181-184. For example, an amount of charge generated by the charge compensation circuit 186 at the first node $N_1$ can be controlled by selecting the capacitances of the first and third variable capacitors 181, 183, and an amount of charge generated by the charge compensation circuit 186 at the second node $N_2$ can be controlled by selecting the capacitances of the second and fourth variable capacitors 182, 184.

The first to fourth variable capacitors 181-184 can be implemented in any suitable manner. In one embodiment, the first to fourth variable capacitors 181-184 include varactors, which can have a capacitance based on an analog tuning voltage.

A charge Q stored on a capacitor can be about equal to V*C, where V is the voltage across the capacitor and C is the capacitance of the capacitor. As described above, the charge compensation circuit 136 of FIG. 3A provides a selectable amount of charge compensation by controlling a voltage difference between voltages used to power the first to fourth charge compensation inverters 141-144, and the charge compensation circuit 186 of FIG. 5 provides a selectable amount of charge compensation by controlling capacitances of the first to fourth variable capacitors 181-184. However, the teachings herein are also applicable to configurations in which a charge compensation circuit provides charge compensation by controlling both voltage and capacitance.

Figure 6:
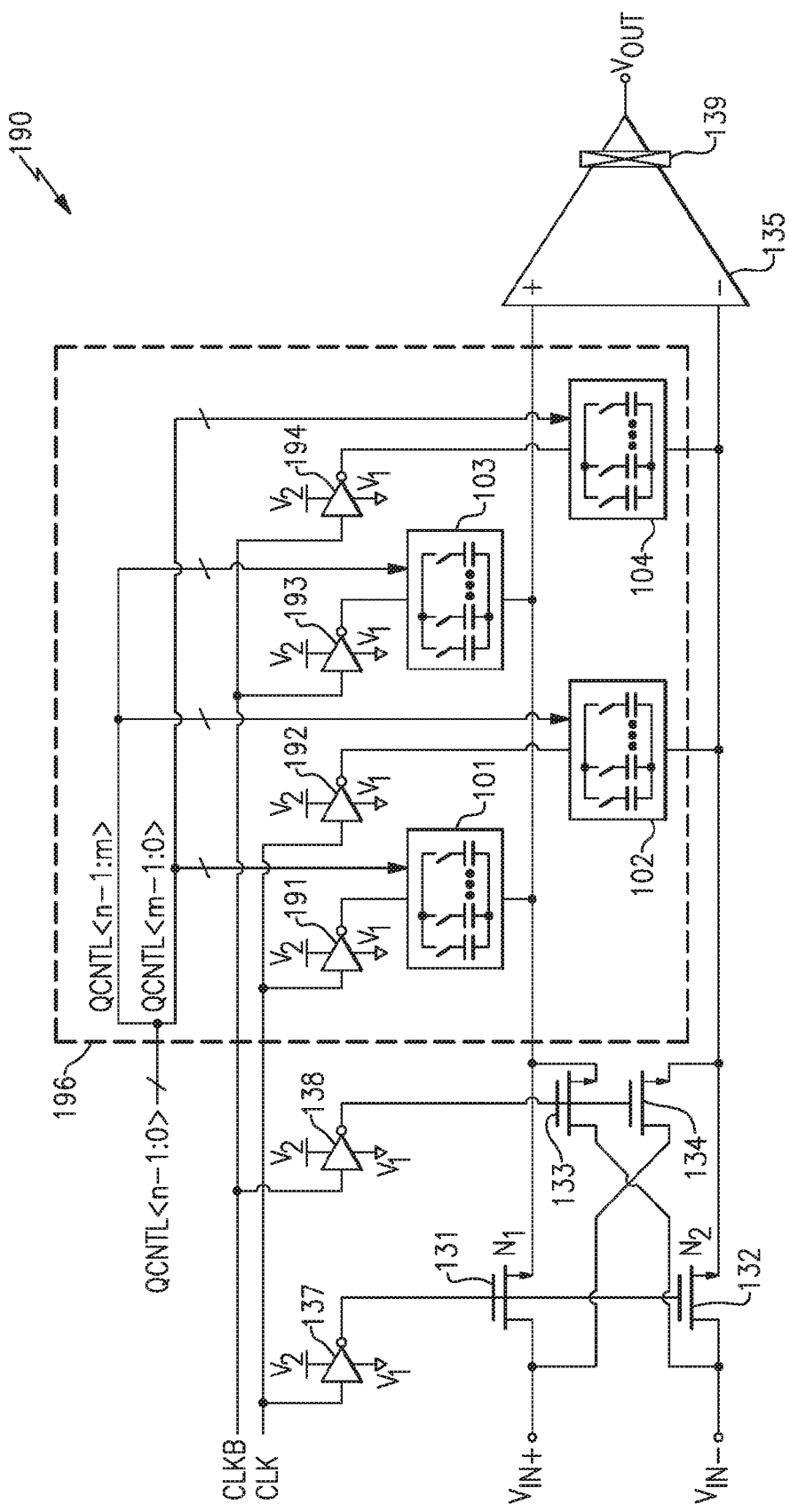
FIG. 6 is a schematic diagram of another embodiment of a chopper amplifier.

FIG. 6 is a schematic diagram of another embodiment of a chopper amplifier 190. The chopper amplifier 190 of FIG. 6 is similar to the chopper amplifier 180 of FIG. 5, except that chopper amplifier 190 of FIG. 6 includes a charge compensation circuit 196 implemented in a different arrangement relative to the charge compensation circuit 186 of FIG. 5.

For example, the charge compensation circuit 196 of FIG. 6 includes first to fourth charge compensation inverters 191-194 and first to fourth capacitor arrays 101-104. As shown in FIG. 6, the first capacitor array 101 includes a first end electrically connected to the output of the first charge compensation inverter 191, a second end electrically connected to the first node $N_1$, and a control input that receives bits QCNTL<m−1:0> of the charge control signal QCNTL<n−1:0>, where m is an integer less than n. Additionally, the second capacitor array 102 includes a first end electrically connected to the output of the second charge compensation inverter 192, a second end electrically connected to the second node $N_2$, and a control input that receives bits QCNTL<n−1:m> of the charge control signal QCNTL<n−1:0>. Furthermore, the third capacitor array 103 includes a first end electrically connected to the output of the third charge compensation inverter 193, a second end electrically connected to the first node $N_1$, and a control input that receives bits QCNTL<n−1:m> of the charge control signal QCNTL<n−1:0>. Additionally, the fourth capacitor array 104 includes a first end electrically connected to the output of the fourth charge compensation inverter 194, a second end electrically connected to the second node $N_2$, and a control input that receives bits QCNTL<m−1:0> of the charge control signal QCNTL<n−1:0>.

The charge compensation circuit 196 of FIG. 6 is similar to the charge compensation circuit 186 of FIG. 5, except that FIG. 6 illustrates a scheme in which charge compensation is provided by controlling digital settings of capacitor arrays rather than by controlling analog tuning voltages of variable capacitors. In one embodiment, the first to fourth capacitors arrays 101-104 include a plurality of capacitors, each having an associated switch. Additionally, the switches can be controlled based on the capacitor array's digital setting, thereby determining an active capacitance of the capacitor array.

Additional details of the chopper amplifier 190 of FIG. 6 can be similar to those described earlier.

Overview of Examples of Electronic Circuits Including Selectable Circuit Channels In certain implementations, an electronic circuit includes a first input terminal, a second input terminal, an input circuit, and a plurality of circuit channels that operate using one or more clock signals. The circuit channels are electrically connected in parallel to one another, and each circuit channel includes a selection logic circuit and a plurality of input switches. The input circuit includes a first input and a second input, and the input switches of the circuit channels are electrically connected between the first and second input terminals and the first and second inputs of the input circuit. The channel selection circuits receive channel selection signals, which can be used to activate one or more of the circuit channels for operation in the electronic circuit, such as by gating the one or more clock signals.

Additionally, a value of the channel selection signals is selected to provide relatively low input bias current for the electronic circuit. For example, mismatch associated with processing variation can lead to the input switches of the circuit channels generating different amounts of charge injection. Additionally, the value of the channel selection signals can be selected to correspond to the combination of the circuit channels having about the smallest input bias current. For example, in certain implementations, the channel selection signals are generated based on data stored in a programmable memory, such as data determined based on observations of the input bias current during testing. In another example, a combination of the circuit channels for the electronic circuit to operate with is determined on-chip during a calibration cycle in which input bias current is observed for different values of the channel selection signals.

Figure 7:
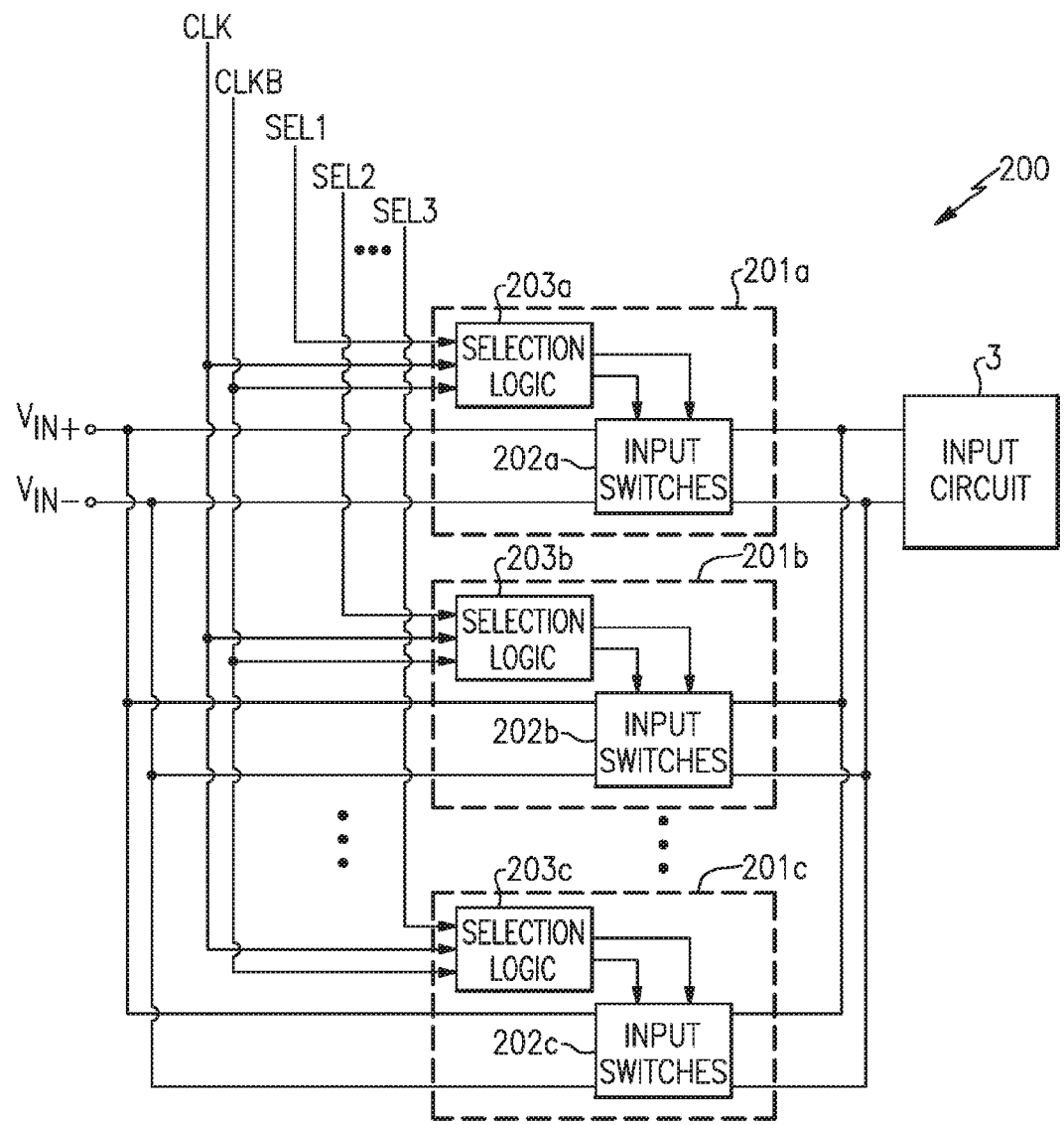
FIG. 7 is a schematic diagram of another embodiment of an electronic circuit.

FIG. 7 is a schematic diagram of another embodiment of an electronic circuit 200. The electronic circuit 200 includes the non-inverting input voltage terminal $V_{IN+}$, the inverting input voltage terminal $V_{IN-}$, the input circuit 3, and first to third circuit channels 201a-201c. Additionally, the electronic circuit 200 receives a non-inverted clock signal CLK, an inverted clock signal CLKB, a first channel selection signal SEL1, a second channel selection signal SEL2, and a third channel selection signal SEL3.

The first circuit channel 201a includes a first plurality of input switches 202a and a first selection logic circuit 203a. The first plurality of input switches 202a are electrically connected between the non-inverting and inverting input voltage terminals $V_{IN+}$, $V_{IN-}$ and the input circuit's first and second inputs. The first selection logic circuit 203a receives the first channel selection signal SEL1 and the non-inverted and inverted clock signals CLK, CLKB. Additionally, the first selection logic circuit 203a generates a first non-inverted local clock signal and a first inverted local clock signal for the first plurality of input switches 202a. The second circuit channel 201b includes a second plurality of input switches 202b and a second selection logic circuit 203b. The second plurality of input switches 202b are electrically connected between the non-inverting and inverting input voltage terminals $V_{IN+}$, $V_{IN-}$ and the input circuit's first and second inputs. The second selection logic circuit 203b receives the second channel selection signal SEL2 and the non-inverted and inverted clock signals CLK, CLKB. Additionally, the second selection logic circuit 203b generates a second non-inverted local clock signal and a second inverted local clock signal for the second plurality of input switches 202b. The third circuit channel 201c includes a third plurality of input switches 202c and a third selection logic circuit 203c. The third plurality of input switches 202c are electrically connected between the non-inverting and inverting input voltage terminals $V_{IN+}$, $V_{IN-}$ and the input circuit's first and second inputs. The third selection logic circuit 203c receives the third channel selection signal SEL3 and the non-inverted and inverted clock signals CLK, CLKB. Additionally, the third selection logic circuit 203c generates a third non-inverted local clock signal and a third inverted local clock signal for the third plurality of input switches 202c.

Although FIG. 7 illustrates a configuration using three circuit channels, the teachings herein are applicable to configurations using more or fewer circuit channels.

The first to third channel selection signals SEL1-SEL3 can be used to include or exclude the first to third pluralities of input switches 202a-202c, respectively, from operation in the electronic circuit's signal path. For example, when the first channel selection signal SEL1 is deactivated, the first selection logic circuit 203a can control the first non-inverted local clock signal and the first inverted local clock signal so as to turn off or open the first plurality of input switches 202a. However, when the first channel selection signal SEL1 is activated, the first selection logic circuit 203a can control the first non-inverted local clock signal based on the non-inverted clock signal CLK and can control the first inverted local clock signal based on the inverted clock signal CLKB such that the first plurality of input switches 202a operate in the electronic circuit's signal path. For example, in one embodiment, the first selection logic circuit 203a gates the non-inverted and inverted clock signals CLK, CLKB based on the first channel selection signal SEL1. Similarly, the second and third selection logic circuits 203b, 203c can be used to control the second and third pluralities of input switches 202b, 202c, respectively, based on the second and third channel selection signals SEL2, SEL3, respectively.

The first to third channels selection signals SEL1-SEL3 can have a value selected to provide relatively low input bias current for the electronic circuit 200. For example, manufacturing variation can result in the input switches having mismatch relative to one another. The mismatch can lead to differences in the amount of charge injected by the input switches during clock signal transitions.

In one embodiment, the value of the first to third channel selection signals SEL1-SEL3 is determined based on data stored in a programmable memory, such as the programmable memory 5 of FIG. 1A. Additionally, during test of the electronic circuit 200, the electronic circuit's input bias current can be observed for different values of the channel selection signals, and a value having about the smallest observed input bias current can be selected, such that the electronic circuit 200 operates with the selected value during operation.

In another embodiment, the value of the first to third channel selection signals SEL1-SEL3 is determined on-chip during a calibration cycle. For example, the electronic circuit 200 can include an input current detection circuit, such as the input current detection circuit 15 of FIG. 1B. Additionally, the input current detection circuit can be used to observe the electronic circuit's input bias current for different values of the channel selection signals during a calibration cycle. Furthermore, the input current detection circuit can set the value of the first to third channel selection signals SEL1-SEL3 based on the input bias current observations, such as by setting the channel selection signals to a value associated with the smallest observed input bias current magnitude.

The selected combination of circuit channels can be associated with one or more active circuit channels. For example, in a configuration including n circuit channels, there should be $2^n-1$ channel combinations in which at least one circuit channel is active, and all or part of these combinations can be observed to select a combination with about the smallest input bias current.

In certain configurations, the number of active channels can be pre-determined, so as to keep the number of active switches constant regardless of original input bias current. For example, in a configuration including n circuit channels, m circuit channels can be selected as active, where m is an integer smaller than n. In such a configuration, n choose m (nCm) channel combinations can be available.

Figure 8:
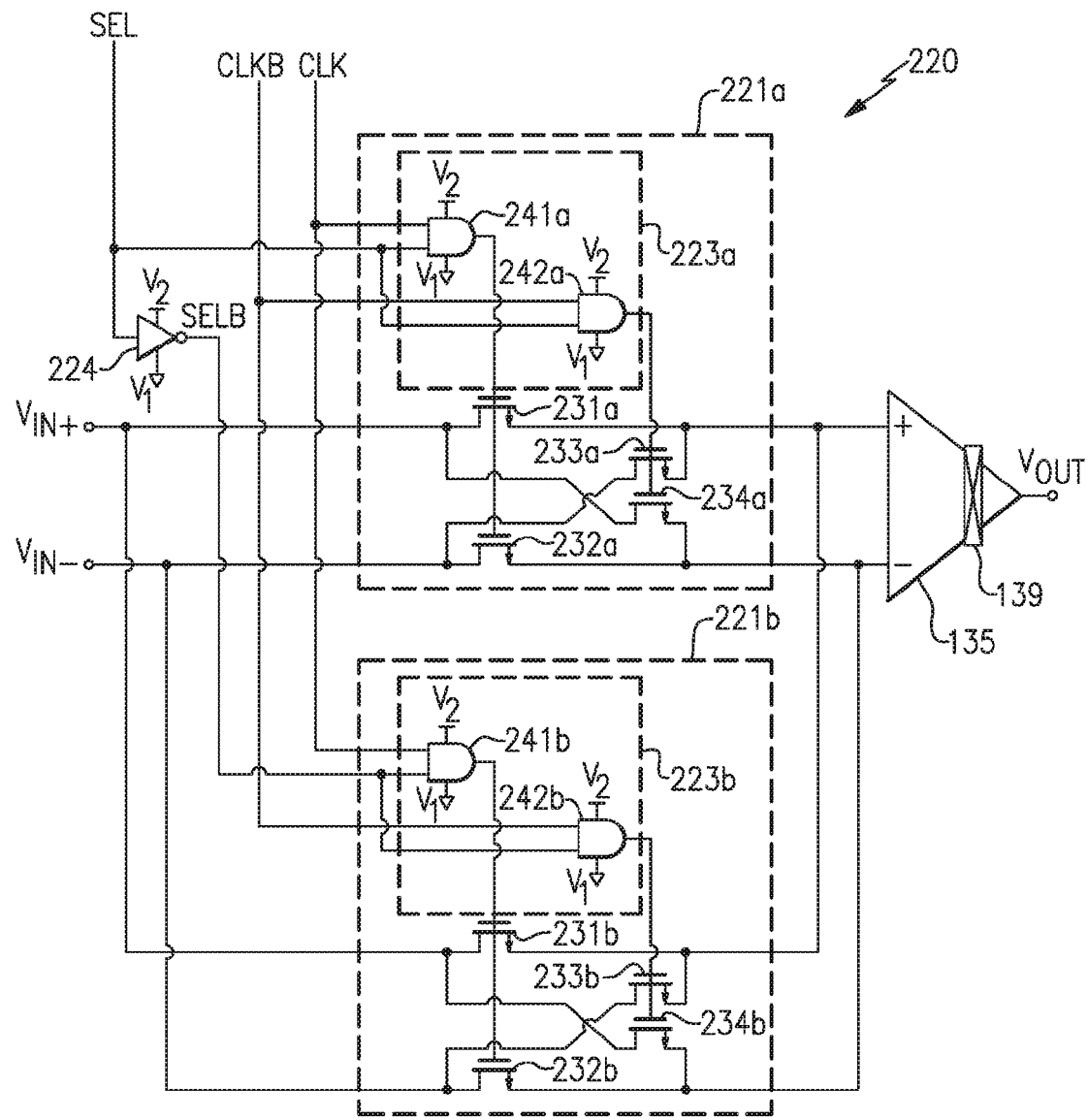
FIG. 8 is a schematic diagram of another embodiment of a chopper amplifier.

FIG. 8 is a schematic diagram of another embodiment of a chopper amplifier 220. The chopper amplifier 220 includes non-inverting and inverting input voltage terminals $V_{IN+}$, $V_{IN-}$, the output voltage terminal $V_{OUT}$, a first selection inverter 224, a first circuit channel 221a, and a second circuit channel 221b. As shown in FIG. 8, the chopper amplifier 220 receives a non-inverted channel selection signal SEL, a non-inverted clock signal CLK, and an inverted clock signal CLKB. Additionally, the first selection inverter 224 is configured to logically invert the non-inverted channel selection signal SEL to generate an inverted channel selection signal SELB.

The first circuit channel 221a includes a first selection logic circuit 223a and a first plurality of input switches including a first FET 231a, a second FET 232a, a third FET 233a, and a fourth FET 234a. The first selection logic circuit 223a includes a first AND gate 241a configured to perform a logical AND operation of the non-inverted clock signal CLK and the non-inverted channel selection signal SEL to generate a first non-inverted local clock signal for controlling the gates of the first and second FETs 231a, 232a. Additionally, the first selection logic circuit 223a further includes a second AND gate 242a configured to perform a logical AND operation of the inverted clock signal CLKB and the non-inverted channel selection signal SEL to generate a first inverted local clock signal for controlling the gates of the third and fourth FETs 233a, 234a. The drains of the first and fourth FETs 231a, 234a are electrically connected to the non-inverting input voltage terminal $V_{IN+}$, and the drains of the second and third FETs 232a, 233a are electrically connected to the inverting input voltage terminal $V_{IN-}$. Additionally, the sources of the first and third FETs 231a, 233a are electrically connected to the first input of the amplification circuit 135, and the sources of the second and fourth FETs 232a, 234a are electrically connected to the second input of the amplification circuit 135.

The second circuit channel 222a includes a second selection logic circuit 223b and a second plurality of input switches including a first FET 231b, a second FET 232b, a third FET 233b, and a fourth FET 234b. The second selection logic circuit 223b includes a first AND gate 241b configured to perform a logical AND operation of the non-inverted clock signal CLK and the inverted channel selection signal SELB to generate a second non-inverted local clock signal for controlling the gates of the first and second FETs 231b, 232b. Additionally, the second selection logic circuit 223b further includes a second AND gate 242b configured to perform a logical AND operation of the inverted clock signal CLKB and the inverted channel selection signal SELB to generate a second inverted local clock signal for controlling the gates of the third and fourth FETs 233b, 234b. The drains of the first and fourth FETs 231b, 234b are electrically connected to the non-inverting input voltage terminal $V_{IN+}$, and the drains of the second and third FETs 232b, 233b are electrically connected to the inverting input voltage terminal $V_{IN-}$. Additionally, the sources of the first and third FETs 231b, 233b are electrically connected to the first input of the amplification circuit 135, and the sources of the second and fourth FETs 232b, 234b are electrically connected to the second input of the amplification circuit 135.

In one embodiment, the input bias current of the chopper amplifier 220 is measured when the non-inverted channel selection signal SEL is logically low, and when the non-inverted channel selection signal SEL is logically high. Additionally, the value of the non-inverted channel selection signal SEL having smaller input bias current can be selected, such that the chopper amplifier 220 operates with the selected value during operation. In one embodiment, the measurements of input bias current are performed during test of a fabricated integrated circuit (IC) that includes the chopper amplifier 220. Thereafter, a programmable memory of the IC is programmed with data corresponding to the selected value. In another embodiment, the measurements of input bias current are performed on-chip during a calibration cycle.

Although FIG. 8 shows a configuration of a chopper amplifier including two circuit channels, the teachings herein are applicable to chopper amplifiers including additional circuit channels. Furthermore, in certain configurations, channel select signals can be used to activate more than one circuit channel at a time.

Additional details of the chopper amplifier 220 can be similar to those described earlier.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

APPLICATIONS

Devices employing the above described schemes can be implemented into various electronic devices. Examples of the electronic devices can include, but are not limited to, consumer electronic products, parts of the consumer electronic products, electronic test equipment, medical imaging and monitoring, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An electronic circuit comprising:
   a first input terminal and a second input terminal configured to receive a differential input signal;
   an input circuit including a differential input; and
   a plurality of circuit channels controlled by one or more clock signals, wherein each circuit channel of the plurality of circuit channels comprises:
      a plurality of input switches configured to control passage of the differential input signal through the circuit channel to the differential input of the input circuit; and
      a channel selection circuit configured to selectively activate the circuit channel based on a value of one or more channel selection signals,
   wherein the value of the one or more channel selection signals controls an input bias current of the electronic circuit arising from charge injected by transitions of the one or more clock signals.

2. The electronic circuit of claim 1, wherein the plurality of circuit channels comprises at least three circuit channels.

3. The electronic circuit of claim 2, wherein the value of the one or more channel selection signals activates more than one of the at least three circuit channels.

4. The electronic circuit of claim 1, wherein the plurality of circuit channels are electrically connected in parallel with one another.

5. The electronic circuit of claim 1, wherein the one or more channel selection signals are configured to activate one or more of the plurality of circuit channels based on gating the one or more clock signals.

6. The electronic circuit of claim 1, wherein the value of the one or more channel selection signals activates a combination of the plurality of circuit channels having a smallest input bias current.

7. The electronic circuit of claim 1, further comprising a programmable memory, wherein the value of the one or more channel selection signals is selected based at least in part on data stored in the programmable memory.

8. The electronic circuit of claim 1, wherein the input circuit comprises an amplification circuit.

9. The electronic circuit of claim 8, wherein the plurality of input switches are implemented as input chopping switches.

10. The electronic circuit of claim 8, wherein the plurality of input switches are implemented as autozero switches.

11. A method of reducing input bias current, the method comprising:
    providing a differential input voltage between a first input terminal and a second input terminal of an electronic circuit that comprises an input circuit and a plurality of circuit channels;
    controlling the plurality of circuit channels using one or more clock signals, each circuit channel of the plurality of circuit channels comprising a plurality of input switches for controlling passage of the differential input signal through the circuit channel to the input circuit;
    selectively activating one or more circuit channels of the plurality of circuit channels based on a value of one or more channel selection signals, wherein selectively activing the one or more circuit channels comprises controlling a plurality of channel selection circuits of the plurality of circuit channels using the one or more channel selection signals; and
    controlling an input bias current of the electronic circuit arising from charge injected by transitions of the one or more clock signals based on the value of the one or more channel selection signals.

12. The method of claim 11, wherein selectively activating the one or more circuit channels comprises gating the one or more clock signals using the one or more channel selection signals.

13. The method of claim 11, wherein selectively activating the one or more circuit channels comprises activating a combination of the plurality of circuit channels having a smallest input bias current.

14. The method of claim 11, further comprising determining the value of the one or more channel selection signals based on observations of the input bias current during a calibration cycle of the electronic circuit.

15. The method of claim 11, further comprising determining the value of the one or more channel selection signals based at least in part on data stored in a programmable memory.

16. The method of claim 11, wherein the plurality of circuit channels comprises at least three circuit channels, wherein the method further comprises selectively activating more than one of the at least three circuit channels.

17. An amplifier comprising:
a first input terminal and a second input terminal configured to receive a differential input signal;
an amplification circuit including a differential input;
a first circuit channel comprising a first plurality of input switches configured to control passage of the differential input signal through the first circuit channel to the differential input of the amplification circuit, wherein the first circuit channel further comprises a first channel selection circuit configured to selectively activate the first circuit channel based on a value of one or more channel selection signals; and
a second circuit channel comprising a second plurality of input switches configured to control passage of the differential input signal through the second circuit channel to the differential input of the amplification circuit, wherein the second circuit channel further comprises a second channel selection circuit configured to selectively activate the second circuit channel based on the value of the one or more channel selection signals,
wherein the value of the one or more channel selection signals controls an input bias current of the amplifier arising from charge injected by transitions of one or more clock signals.

18. The amplifier of claim 17, further comprising a third circuit channel comprising a third plurality of input switches configured to control passage of the differential input signal through the third circuit channel to the differential input of the amplification circuit, wherein the third circuit channel further comprises a third channel selection circuit configured to selectively activate the third circuit channel based on the value of the one or more channel selection signals.

19. The amplifier of claim 17, wherein the first plurality of input switches and the second plurality of input switches are implemented as input chopping switches.

20. The amplifier of claim 17, wherein the first plurality of input switches and the second plurality of input switches are implemented as autozero switches.

\* \* \* \* \*